United States Patent [19]
Kurtz et al.

[11] Patent Number: 5,574,295
[45] Date of Patent: Nov. 12, 1996

[54] DIELECTRICALLY ISOLATED SIC MOSFET

[75] Inventors: Anthony D. Kurtz, Teaneck, N.J.; Andrew V. Bemis, Chestnut Ridge, N.Y.

[73] Assignee: Kulite Semiconductor Products, Leonia, N.J.

[21] Appl. No.: 512,892

[22] Filed: Aug. 9, 1995

[51] Int. Cl.$^6$ .................. H01L 31/0312; H01L 29/80; H01L 29/00
[52] U.S. Cl. .................. 257/77; 257/262; 257/510
[58] Field of Search .................. 257/77, 256, 260, 257/262, 369, 510

[56] References Cited

U.S. PATENT DOCUMENTS

| | | | |
|---|---|---|---|
| 4,272,880 | 6/1981 | Pashley | 257/351 |
| 4,282,648 | 8/1981 | Yu et al. | 257/369 |
| 5,001,531 | 3/1991 | Yamaguchi et al. | 257/253 |
| 5,323,022 | 6/1994 | Glass et al. | 257/77 |
| 5,326,991 | 7/1994 | Takasu | 257/77 |
| 5,367,190 | 11/1994 | Funaki | 257/412 |
| 5,371,396 | 12/1994 | Vinal et al. | 257/412 |

*Primary Examiner*—Wael Fahmy
*Attorney, Agent, or Firm*—Plevy & Associates

[57] ABSTRACT

A metal-oxide-semiconductor field-effect transistor (MOSFET) device comprising a carrier wafer and a silicon gate region disposed on the carrier wafer. A source region and a drain region made from 3C-silicon carbide are disposed on the carrier wafer above the gate region. A gate oxide, derived from silicon, separates the source and drain regions from the gate region. Laterally oriented oxide trenches separate and dielectrically isolate the MOSFET device from other devices on the carrier wafer. Further, the MOSFET device described above is manufactured in a method comprising the steps of providing a carrier wafer having an oxide layer formed on a surface thereof. A layer of silicon having a given level of conductivity is bonded to the oxide layer of the carrier wafer. Selected portions of the layer of silicon are oxidized to create a plurality of dielectrically isolated silicon islands, one of which forms a gate region. A layer of silicon dioxide is then formed over the dielectrically isolated islands of silicon. Two layers of silicon carbide are then bonded to the layer of silicon dioxide. A source region and a drain region are each formed from the layers of silicon carbide. Selected portions of one of the two layers of silicon carbide are oxidized to dielectrically isolate the source region and the drain region from other semiconductor devices located on the carrier wafer.

10 Claims, 7 Drawing Sheets

DIELECTRICALLY ISOLATED SIC MOSFET

FIELD OF INVENTION

The present invention relates generally to semiconductor devices and more particularly, to a metal-oxide-silicon field-effect transistor (MOSFET) fabricated from silicon carbide (SIC).

BACKGROUND OF THE INVENTION

The implementation of beta-silicon carbide (3C-SiC) in the fabrication of semiconductor devices has been very limited to date. As is well known, SiC has a wide bandgap (2.2 eV for 3C-SiC and 3 eV for 6H-SiC) and high melting point (2800° C.). This makes SiC an excellent semiconductor material for high temperature applications with 6H-SiC being the material of choice in most applications. This remains the case even though the cost of using 3C-SiC is significantly less than that of 6H-SiC.

The preference for 6H-SiC results from essentially two major problems associated with semiconductor devices fabricated from 3C-SiC. The first problem relates to the high amount of leakage current from the metallurgical pn junctions that is not expected from such a large bandgap material. More specifically, the pn junctions formed in 3C-SiC leak current 100–1000 times as much as a silicon pn junction. The other problem that semiconductor devices fabricated from 3C-SiC exhibit is an extremely low surface mobility. This problem is also associated with semiconductor devices fabricated from 6H-SiC. The extremely low surface mobility exhibited by SiC semiconductor devices is believed to be cause by the poor quality of the silicon dioxide (oxide) formed on SiC, and the poor interfacing between the oxide and the bulk SiC.

The first of these two problems is by far the most significant since most integrated circuit devices require one or more metallurgical pn junctions in reverse bias to function and isolate the devices from the surrounding circuitry. The second problem mainly impacts the circuit density that can be achieved, and this in turn impacts the cost of manufacturing. More specifically, a greater circuit density can be achieved with a high mobility semiconductor material than with a low mobility semiconductor material. This is because in order for the device to support a given amount current, the device made from the low mobility semiconductor material must have a channel width that is the ratio of the high to low mobilities multiplied by the channel width of the high mobility device. This invention overcomes both of these restrictions.

It is, therefore, a primary object of the present invention to provide a dielectrically isolated P-MOSFET device which substantially overcomes and eliminates the problems described above.

SUMMARY OF THE INVENTION

A metal-oxide-semiconductor field-effect transistor (MOSFET) device comprising a carrier wafer and a silicon gate region are disposed on the carrier wafer. A source region and a drain region made from silicon carbide are disposed on the carrier wafer above the gate region. A gate oxide, derived from silicon, separates the source and drain regions from the gate region. Laterally oriented oxide trenches separate and dielectrically isolate the MOSFET device from other devices on the carrier wafer.

The MOSFET device described above is manufactured in a method comprising the steps of providing a carrier wafer having an oxide layer formed on a surface thereof. A layer of silicon having a given level of conductivity is bonded to the oxide layer of the carrier wafer. Selected portions of the layer of silicon are oxidized to create a plurality of dielectrically isolated silicon islands, one of which forms a gate region. A layer of silicon dioxide is then formed over the dielectrically isolated islands of silicon. Two layers of silicon carbide are then bonded to the layer of silicon dioxide. A source region and a drain region are each formed from the layers of silicon carbide. Selected portions of one of the two layers of silicon carbide are oxidized to dielectrically isolate the source region and the drain region from other semiconductor devices located on the carrier wafer.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Figure 1:
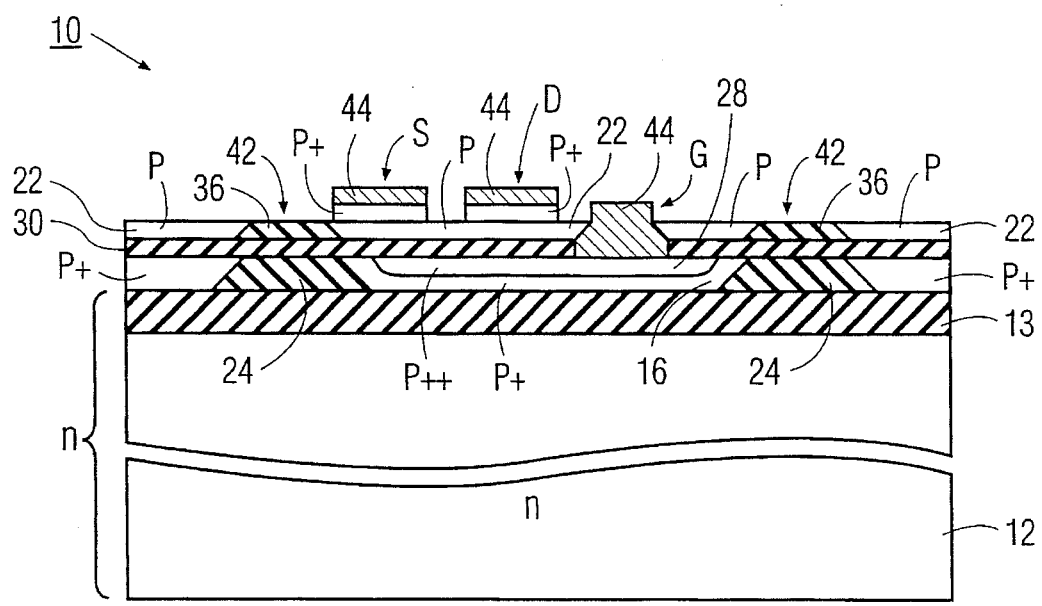
FIG. 1 is a cross-sectional view which depicts an exemplary embodiment of the MOSFET device of the present invention.

The dielectrically isolated 3C-SiC P-MOSFET device of the present invention is exemplified in FIG. 1 and is designated by the numeral 10. As can be seen, the MOSFET device 10 substantially overcomes the problem of having a metallurgical pn junction in the reverse bias mode by eliminating the junction itself. The source S and the drain D of the MOSFET device 10 are constructed out of a p-type material, along with the gate G of the MOSFET device 10 which is comprised of layers 28 and 16. Thus, no metallurgical pn junction exists in the MOSFET device 10 of the present invention. The current leakage problem associated with the pn junction, which causes a lack of isolation between the device and the surrounding circuitry, is substantially overcome and eliminated in the present invention by utilizing dielectric isolation instead of junction isolation.

Dielectric isolation is accomplished in the present invention by implementing wafer bonding techniques as will be later explained. The wafer bonding techniques allow the substrate junction of the prior art devices to be replaced by a layer of oxide 30 as shown in FIG. 1. Moreover, the present invention implements anodization and oxidation techniques to replace the lateral junction located between the devices in prior art designs with an oxide trench 42 as also shown in FIG. 1.

The extremely low mobility problem caused by the poor quality of the oxide formed on SiC and the poor oxide-SiC interface, is substantially eliminated in the present invention by the utilization of the aforementioned wafer bonding techniques. Referring still to FIG. 1, the implementation of these wafer bonding techniques enables the gate oxide 30 of the MOSFET device 10 to be thermally created from silicon (Si). Implementation of wafer bonding in the present invention also substantially improves the oxide-SiC interface.

The MOSFET device 10 of the present invention operates in the following manner. At a zero bias condition, the difference between the work function of the p+ Si of layer 16 and the p SiC of layer 22 will cause a depletion region to be formed in the p SiC of layer 22. When a volume is depleted, the mobile charge is removed and the fixed ionic charge remains, thus, in the case of a p material, an n type charge remains. Accordingly, the two junctions do exist for this device, but they are oriented between the depleted and undepleted regions of the p SiC of layer 22. If the depletion region extends through the entire body (layers 16 and 28) of the MOSFET device 10, then it is classified as an enhancement mode device, otherwise it is classified as a depletion mode device. This difference primarily depends upon the doping level of the p SiC layer 22, the thickness of that layer, and of the dopant used for the gate G, either p+ as in the preferred embodiment shown in FIG. 1, or n+. As a potential is applied to the MOSFET device's 10 gate G the depth of the depletion region will vary, thus, creating a transistor action.

Accordingly, the MOSFET device 10 of the present invention has many innovative features that are not taught in the prior art. One is the use of the oxide layer 30 formed on a Si substrate 12 of a handle wafer 11. Another feature includes the bonding the oxide layer 30 to the SiC layer 22 to form the gate oxide. The gate oxide 30 is designed not to have the same mobility limiting features which is inherent in an oxide that is formed on SiC. Still another feature is the incorporation of an anodic etch followed by an oxidation step in both the Si layer at 24 and the SiC layer at 36, as will be later explained, that isolate the Si regions 16, 28 and the SiC regions 22 respectfully. A further feature is the lack of metallurgical pn junctions which in prior art MOSFET devices fabricated from 3C-SiC form poor metallurgical junctions that retard device performance.

Since the MOSFET device 10 of the present invention is dielectrically isolated, it exhibits all the advantages associated with dielectric isolation including lower substrate/sidewall capacitance, no parasitic devices (latch-up device), radiation hardness, and higher temperature operation. More specifically, since the source/drain and the body/channel of the MOSFET device 10 of the present invention are made from SiC, it exhibits the higher breakdown fields, the higher saturation velocity, and the higher temperature operation that are characteristic of devices made from SiC as compared to devices made from Si.

The MOSFET device 10 shown in FIG. 1 is fabricated according to the following method which utilizes two fusion bonding steps. The first fusion bonding step bonds the oxide layer of a handle wafer to the highly doped gate material of a first n-type silicon sacrificial wafer. The second fusion bonding step bonds the gate oxide formed on the handle wafer to SiC layers that are formed on a second n-type silicon sacrificial wafer.

Figure 2:
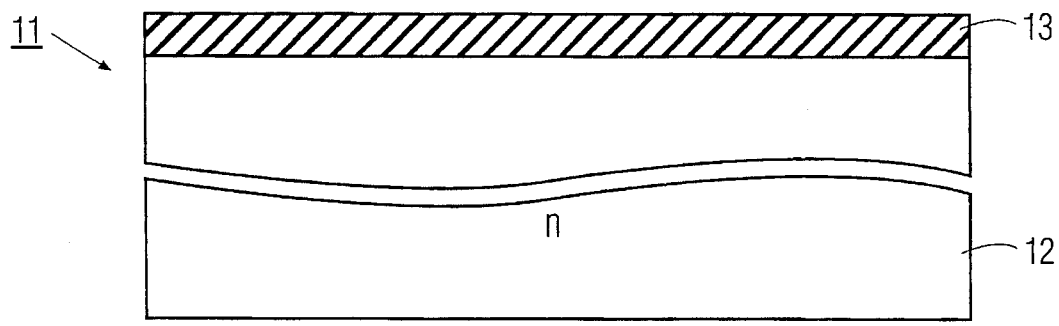
FIG. 2 is a cross-sectional view which depicts a carrier wafer used in fabricating the MOSFET device of FIG. 1.

Referring to FIG. 2, there is the handle wafer 11 which carries the MOSFET 10 of FIG. 1. The handle wafer 11 is comprised of an N- or P-type silicon substrate 12 which has a layer of oxide 13 disposed on one of its surfaces. The layer of oxide 13 has a preferred thickness of approximately 2–4 um and can be grown by using conventional oxidation or chemical vapor deposition (CVD) techniques.

Figure 3:
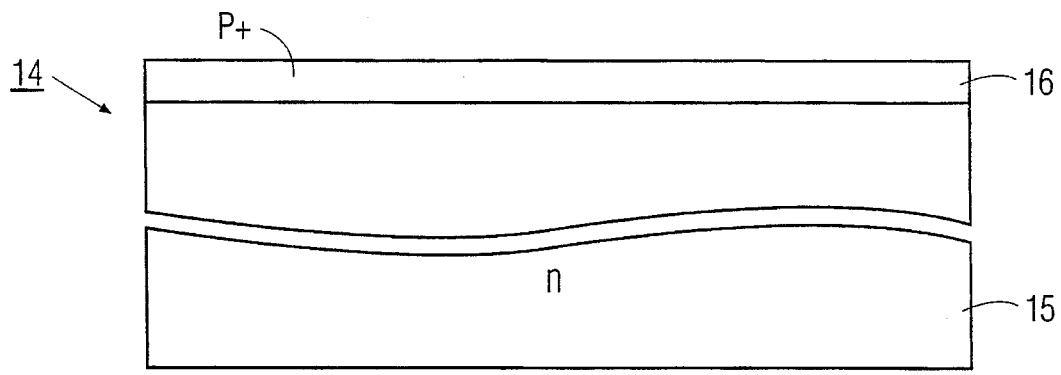
FIG. 3 is a cross-sectional view which depicts a first sacrificial wafer used in fabricating the MOSFET device of FIG. 1.

FIG. 3 depicts a first sacrificial wafer 14 that is used to fabricate the MOSFET 10 of FIG. 1. The first sacrificial wafer 14 comprises an n-type silicon substrate 15. As can be seen, a P+(E18–E19) diffused layer 16 has been selectively created in one of the surfaces of the n-type substrate 15 using conventional diffusion or ion implantation techniques. The diffused layer 16 should extend approximately 1 um into surface of the n-type substrate 15.

Figure 4:
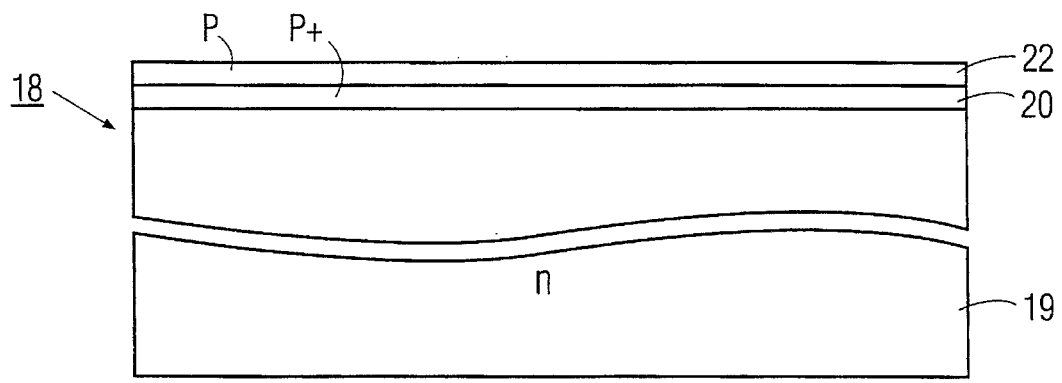
FIG. 4 is a cross-sectional view which depicts a second sacrificial wafer used in fabricating the MOSFET device of FIG. 1.

FIG. 4 depicts a second sacrificial wafer 18 that is also used to fabricate the MOSFET 10 of FIG. 1. The second sacrificial wafer 18 comprises an n-type silicon substrate 19. Two 3C-SiC layers are shown epitaxially grown or otherwise deposited on a surface of the n-type silicon substrate 19 using conventional well known techniques. For example, 3C-SiC layers can be obtained by using low temperature chemical vapor deposition performed in a rapid thermal processing CVD reactor using silane diluted in hydrogen at a temperature of 830° C. and a total pressure of about 2 Torr. The outer layer 22 preferably has a P–(E15–E17) conductivity and a preferred thickness of approximately 0.5–1.0 um. The inner layer 20 has a preferred P+(E19–E20) conductivity and a preferred thickness of approximately 0.5–1.0 um. The thickness of these layers will vary with the processing time.

The dopant profiles of the three wafers 11, 14 and 18 can be accomplished by epitaxial deposition or any other suitable technique known to those skilled in the art.

Figure 5A:
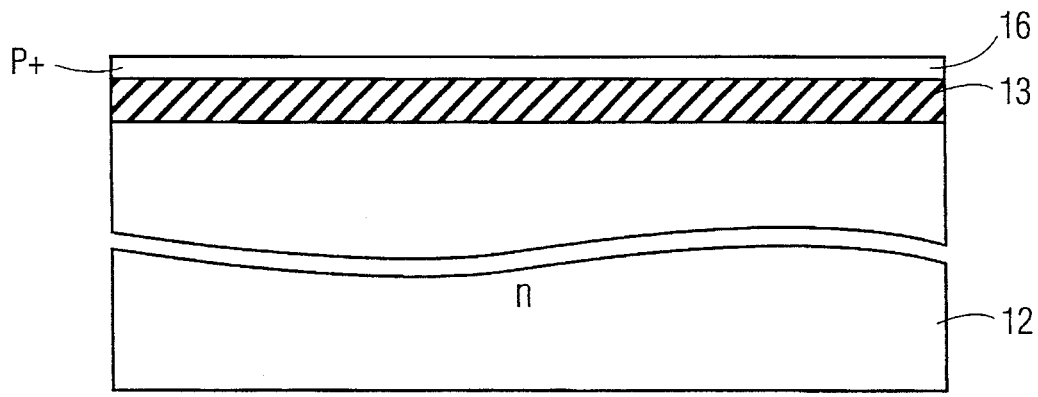
FIG. 5A is a cross-sectional view which depicts the bonding together of the first sacrificial wafer of FIG. 3 to the carrier wafer of FIG. 2.

The first sacrificial wafer 14 of FIG. 3 is bonded to the handle wafer 11 of FIG. 2 in a low temperature boron enhanced fusion bonding process such as the one described in U.S. Pat. No. 5,286,671 entitled FUSION BONDING TECHNIQUE FOR USE IN FABRICATING SEMICONDUCTOR DEVICES, to A. Kurtz et al., issued February 1994, the subject matter of which is incorporated herein by reference. The wafers 11 and 14 are oriented so that the bonding interface is formed by the oxide layer 12 of the handle wafer 11 and the diffused layer 16 of the first sacrificial wafer 14. Next, the N-type Si substrate 15 is etched away using a conventional conductivity selective etching process which leaves only the diffused layer 16 bonded to the handle wafer 11 as shown in FIG. 5A.

Figure 5B:
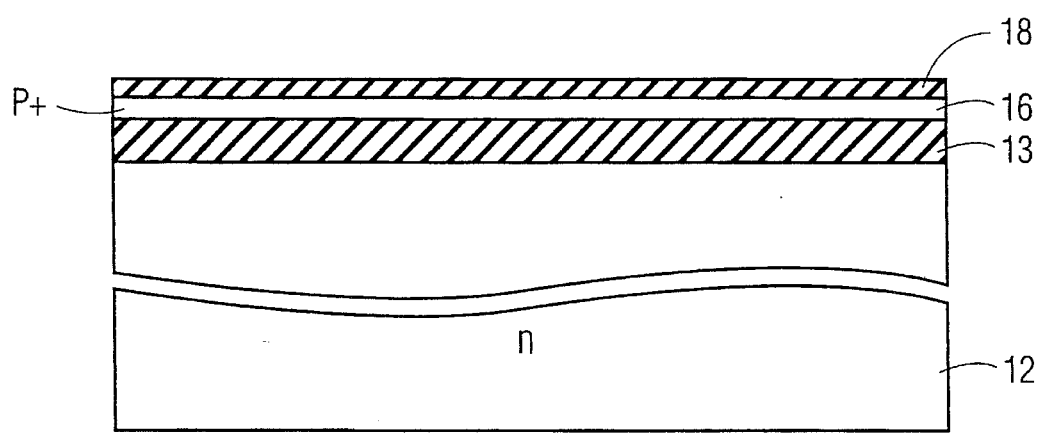
FIGS. 5B–5G are cross-sectional views which depict the fabrication of the gate region of the MOSFET device of FIG. 1.
Figure 5C:
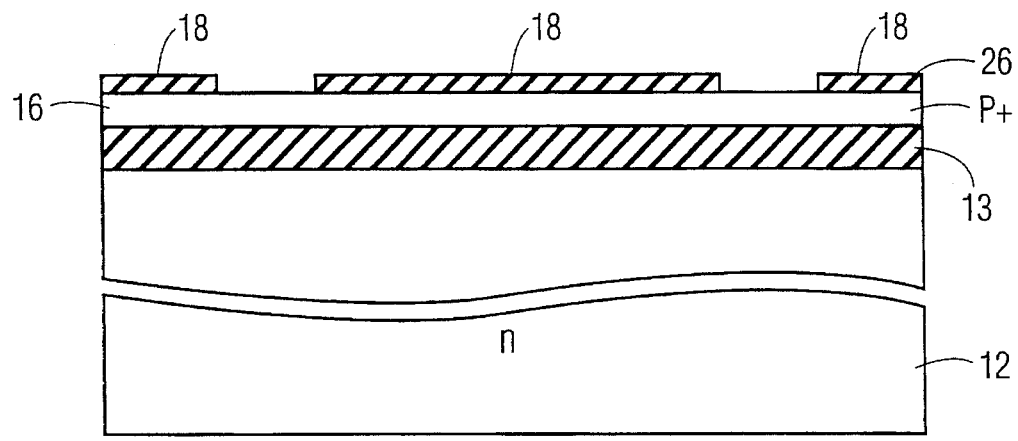

In FIG. 5B, a nitride mask layer 18 has been grown or deposited over the diffused P+layer 16. The thickness of the nitride mask layer 18 is generally on the order of approximately 1000 angstroms. The nitride mask layer is then patterned as shown in FIG. 5C by selectively etching the nitride mask layer 18. This is accomplished by first depositing a layer of quartz (not shown) over the nitride mask layer 18. The quartz layer is then patterned using conventional photolithographic and etching techniques. The patterned quartz layer operates to mask off areas of the nitride mask layer 18 which are to remain after the nitride mask layer 18 is etched. More specifically, the etchant used to etch the nitride mask layer 18 will etch away only the exposed areas of the nitride mask layer 18 which are unprotected by the quartz layer. The patterned quartz layer is subsequently removed leaving the nitride mask layer 18 shown in FIG. 5C. The nitride mask layer 18 will be used to form the oxide trenches 42 shown in FIG.1 as will be explained.

Figure 5D:
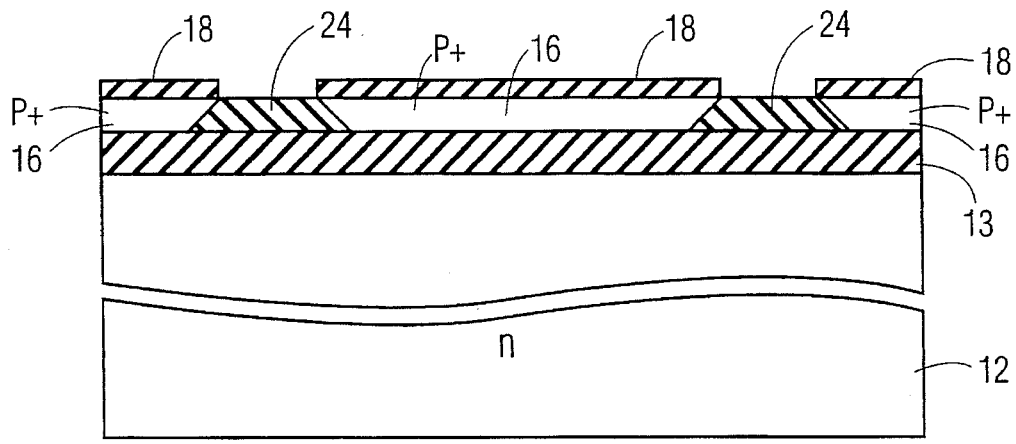

FIG. 5D depicts the structure after anodizing and oxidizing the handle wafer 11 using conventional techniques. As can be seen, each exposed area of the P+ diffused layer 16 not covered by the patterned nitride mask layer 18 has been converted to an oxide 24. This creates dielectrically isolated islands 16 of P+ diffused material.

Figure 5E:
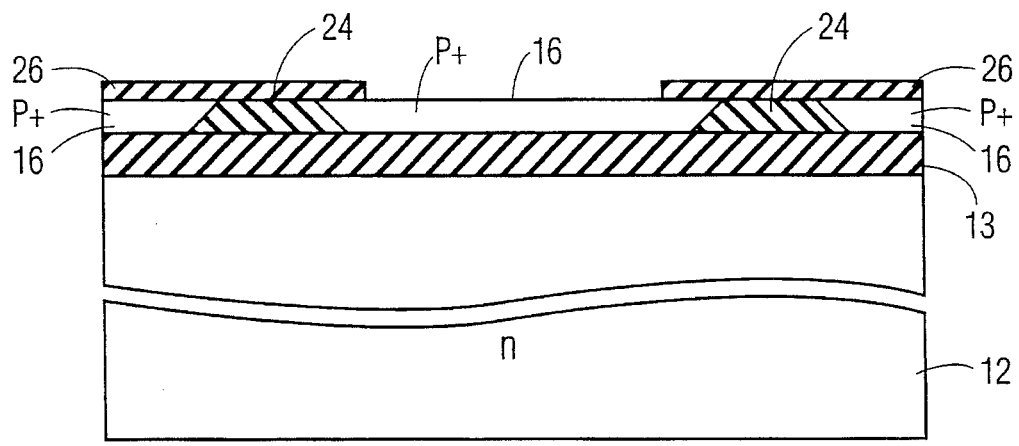

The patterned nitride mask 18 is removed and a patterned oxide diffusion mask 26 is fabricated over the oxide areas 24 and P+ islands 16 of diffused material as depicted in FIG. 5E. The patterned oxide diffusion mask 26 is fabricated by growing or depositing a layer of oxide and utilizing standard photolithographic techniques to pattern the layer oxide into the oxide diffusion mask 26 shown therein in FIG. 5E.

Figure 5F:
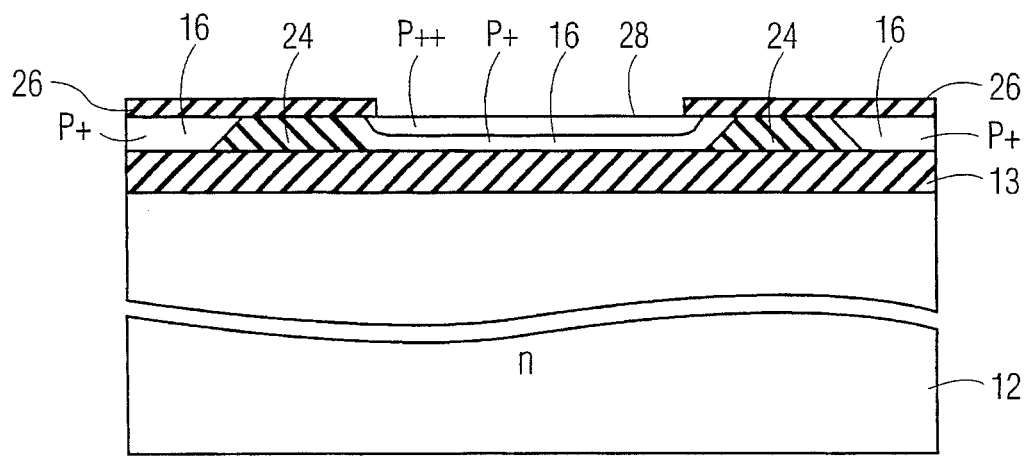

A P++ diffused layer 28 is selectively created in the exposed surface of a selected one of the isolated P+ islands 16 using conventional diffusion or ion implantation techniques. The P++ diffused layer 28 preferably extends approximately 0.25–0.5 um into surface of the selected P+ diffused island 16 as depicted in FIG. 5F. The P++ diffused layer 28 and its associated P+ island 16 form the gate G of the MOSFET of FIG. 1.

Figure 5G:
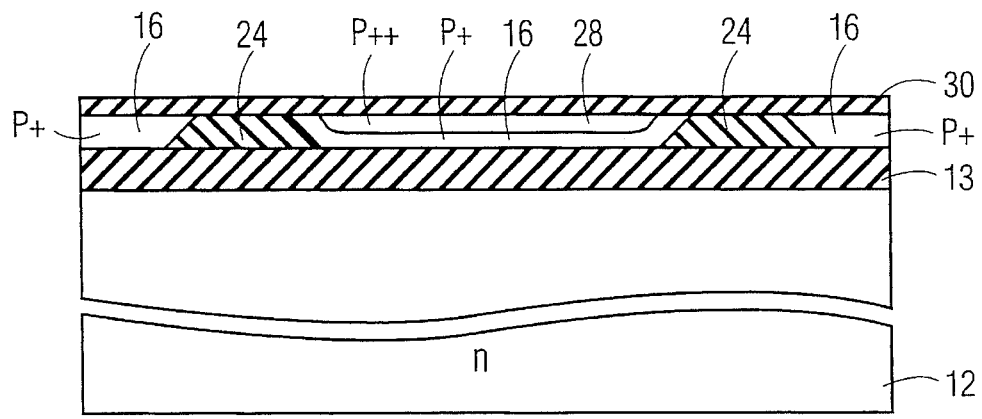

In FIG. 5G, the oxide diffusion mask 26 has been removed and replaced by a layer of high quality oxide which forms the gate oxide layer 30 shown in FIG. 1. The gate oxide layer 30 preferably has an approximate thickness of 200–500 angstroms and is formed by growing or depositing a layer of Si (not shown) over the P+ diffused islands 16 and the oxide regions 24. The Si layer is then converted to silicon dioxide which forms the gate oxide layer 30 using a conventional thermal oxidation technique.

Figure 6A:
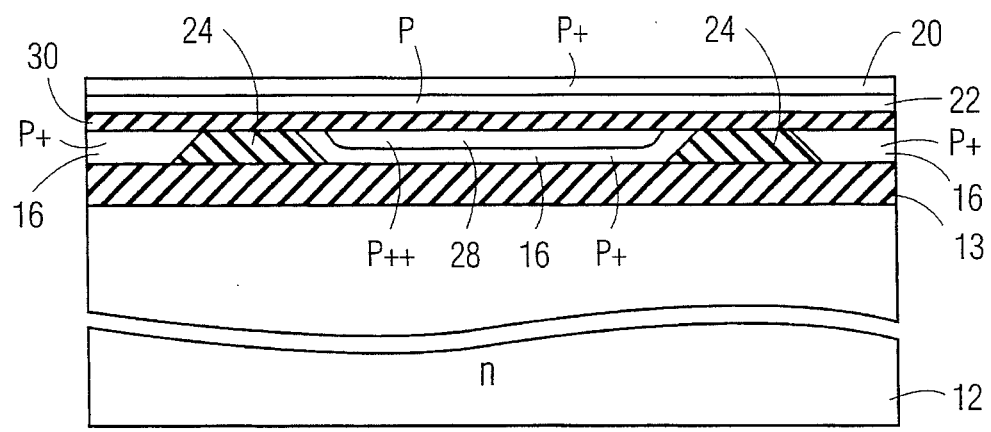
FIG. 6A is a cross-sectional view which depicts the bonding together of the second sacrificial wafer of FIG. 4 to the carrier wafer of FIG. 5G.

In FIG. 6A, shows the gate oxide layer 30 of the handle wafer 11 bonded to the P– 3C-SiC layer 22 of the second sacrificial wafer 18. Further, a conductivity selective etch has been employed to remove the n-type Si substrate 19 of the second sacrificial wafer 18 as shown therein.

Figure 6B:
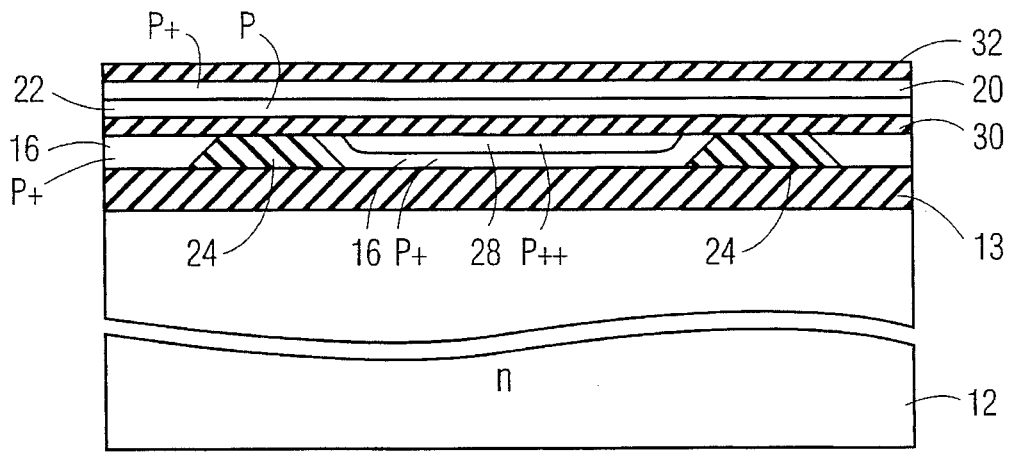
FIGS. 6B–6H are cross-sectional views which depict the fabrication of the source and drain regions of the MOSFET device of FIG. 1.
Figure 6C:
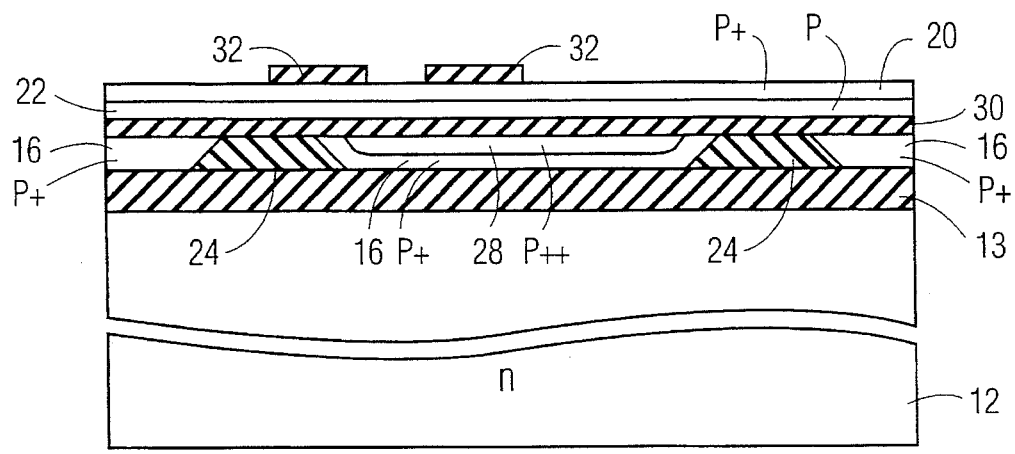

In FIG. 6B, a second nitride mask layer 32 has been grown or deposited over the diffused P+ 3C-SiC layer 20. The thickness of the nitride mask layer 32 is generally on the order of approximately 1000 angstroms. The nitride mask layer is then patterned as shown in FIG. 6C by selectively etching the nitride mask layer 32. The nitride mask layer 32 will be used to pattern underlying diffused P+ 3C-SiC layer 20.

Figure 6D:
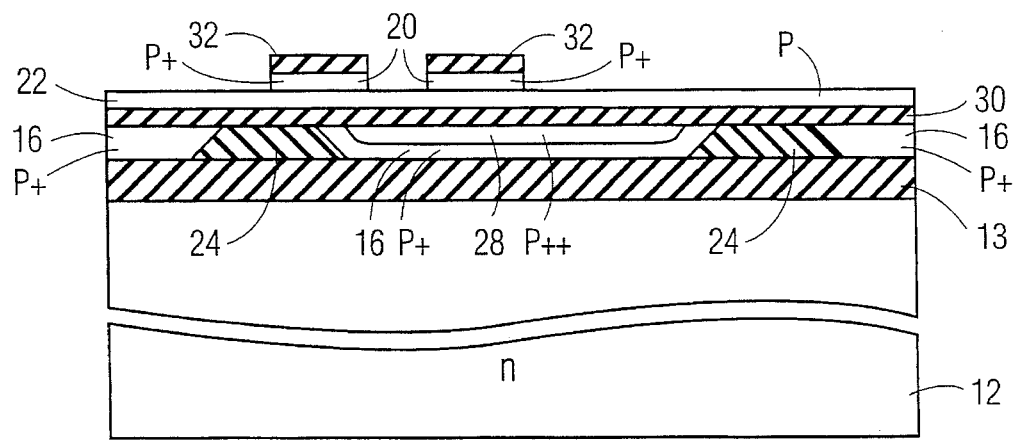

FIG. 6D depicts the results of the removal of most of the P+ 3C-SiC layer using any conventional selective etching technique to form the drain D and the source S for the MOSFET device 10 of FIG. 1.

Figure 6E:
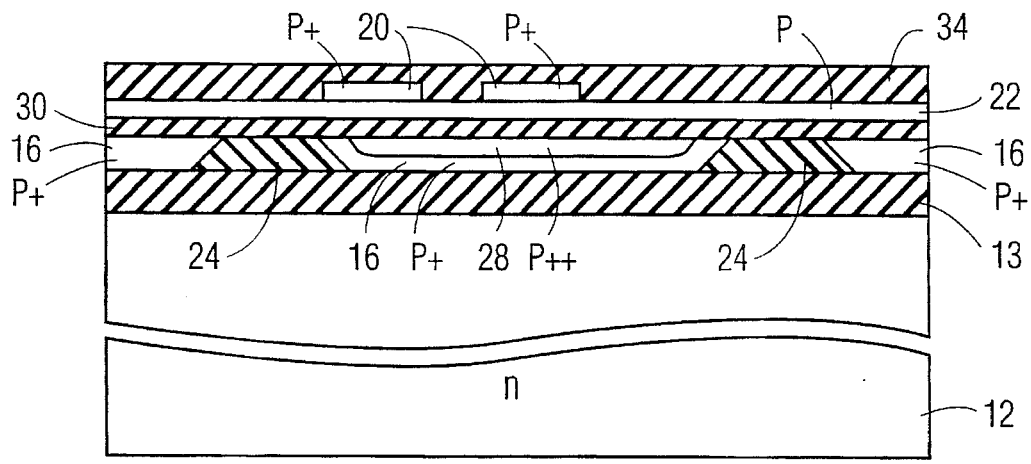
Figure 6F:
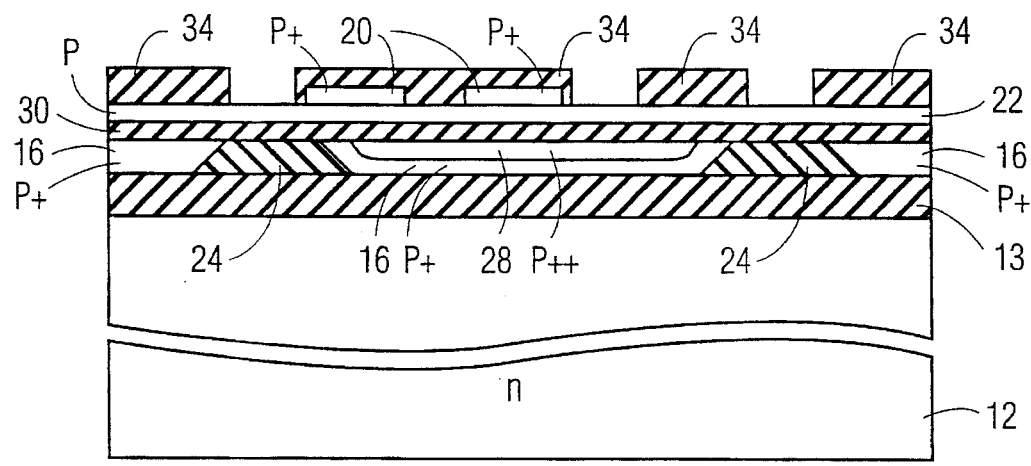

After etching, the nitride mask layer 32 is removed and a third nitride mask layer 34 is deposited over the remaining P+ 3C-SiC islands 20 and the exposed portions of the P-3C-SiC layer 22 as shown in FIG. 6E. In FIG. 6F, the third nitride mask layer 34 has been patterned using the techniques described earlier to produce a mask for the anodization step that is performed to further form the oxide trenches 42 as shown in FIG. 1.

Figure 6G:
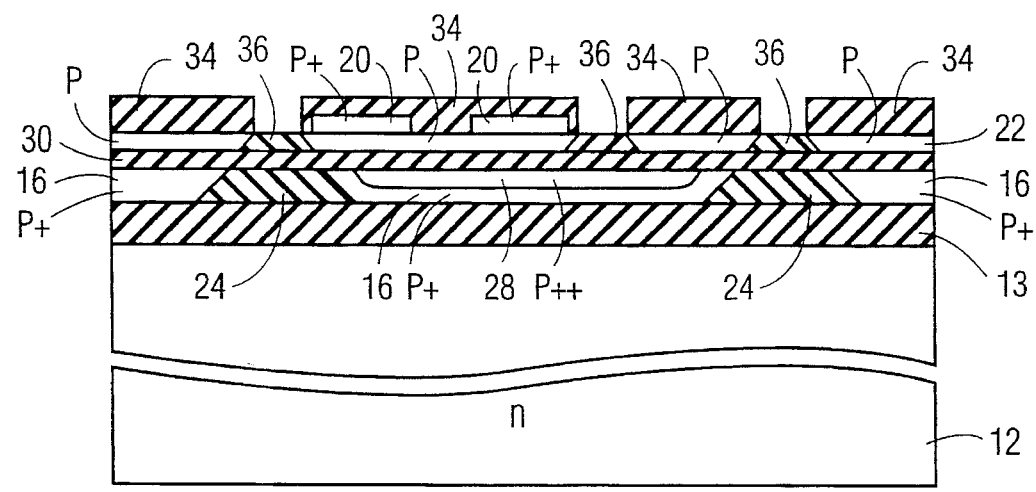

FIG. 6G depicts the structure after anodizing and oxidizing the handle wafer 11 using conventional techniques. As can be seen, each exposed area of the P–3C-SiC not covered by the patterned nitride mask layer 34 has been converted to an oxide 36. This creates dielectrically isolated islands 22 of P–3C-SiC material. The oxide areas 36 coact with underlying portions of the gate oxide layer 30 and the oxide areas 24 to form the oxide trenches 42 described earlier in FIG. 1.

Figure 6H:
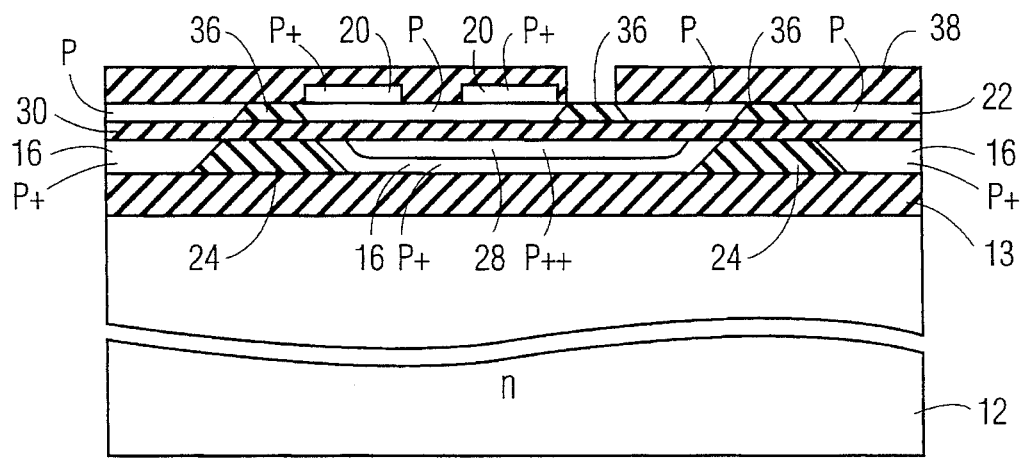
Figure 6I:
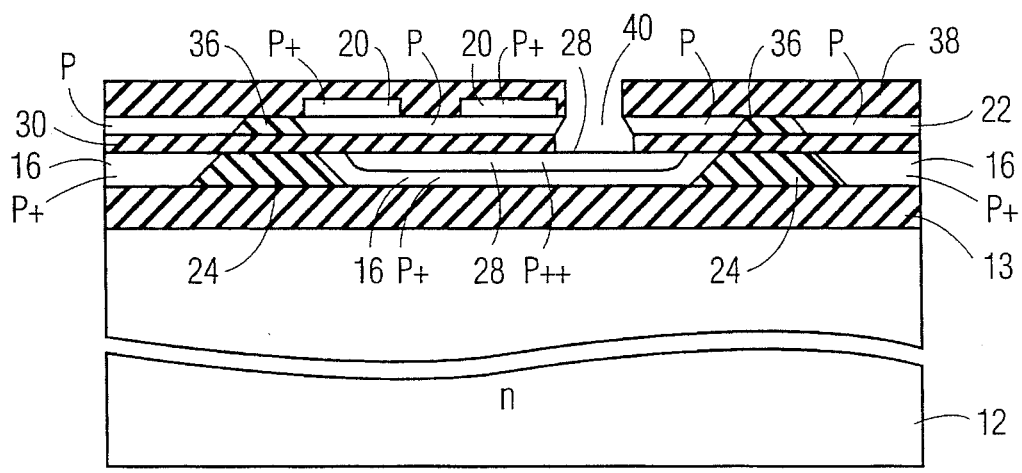
FIGS. 6I and 6J are cross-sectional views which depict the fabrication of the contacts for the source, drain and gate regions of the MOSFET device of FIG. 1.
Figure 6J:
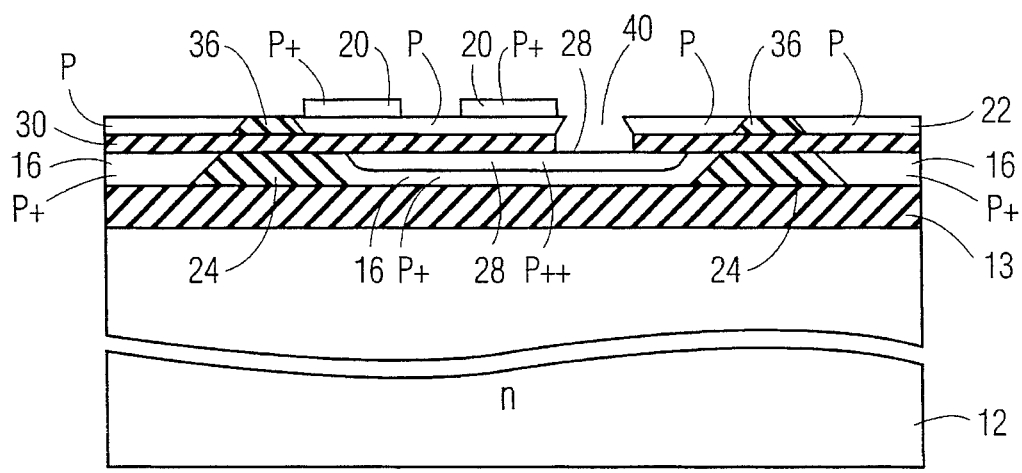

In FIG. 6H the third nitride masking layer 36 has been removed and replace by a fourth patterned nitride layer 38. The fourth patterned nitride layer 38 is used to form a contact for the gate G of the MOSFET device 10 of FIG. 1. More specifically, the exposed oxide island 36 and a portion of the gate oxide layer 30 lying substantially underneath the exposed oxide island 36 are removed in a conventional etching technique. The fourth nitride layer 38 is then removed as shown in FIG. 6J and a patterned metal layer 44 is deposited over the source S, drain D, and gate G areas to form the MOSFET device's contacts as shown in the final structure depicted in FIG. 1.

One skilled in the art should understand that these devices can be combined to form integrated circuitry, and that some of these circuits will require other active (diodes) and passive (resistors and capacitors) elements. These elements may be formed from silicon carbide, or silicon layers currently used in the MOSFET process using additional semiconductor integrated circuit processing techniques. Also, these components maybe added by depositing additional thin film layers to the surface of the device.

It should be understood that the embodiments described herein are merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A metal-oxide-semiconductor field-effect transistor (MOSFET) device comprising:

a carrier wafer;

a gate region disposed on said carrier wafer, said gate region being fabricated from a silicon semiconductive material;

a source region disposed on said carrier wafer above said gate region, said source region being fabricated from a silicon carbide semiconductive material;

a drain region disposed on said carrier wafer above said gate region and spaced laterally from said source region, said drain region being fabricated from said silicon carbide semiconductive material; and a plurality of trenches in said carrier wafer, each of said trenches being oriented laterally between said MOSFET device and other semiconductor devices disposed on said carrier wafer.

2. The device according to claim 1, further comprising a layer of silicon dioxide which has been derived from a silicon semiconductive material, said layer of silicon dioxide operating to dielectrically isolate said gate region from said source region and said drain region.

3. The device according to claim 1, wherein said trenches comprise silicon dioxide and operate to dielectrically isolate said MOSFET device from said other semiconductor devices.

4. The device according to claim 3, wherein a first portion of each of said silicon dioxide trenches is derived from said silicon semiconductive material and a second portion of each of said silicon dioxide trenches is derived from said silicon carbide semiconductive material.

5. The device according claim 1, wherein said silicon semiconductive material and said silicon carbide semiconductive material each have a P type conductivity.

6. The device according to claim 1, wherein said silicon carbide semiconductive material comprises a 3C-silicon carbide semiconductive material.

7. The device according to claim 1, wherein said silicon semiconductive material of said gate region has a P type conductivity.

8. The device according to claim 7, wherein said gate region includes a P++ region and a P+ region.

9. The device according to claim 7, wherein said gate region includes a N++ region and a P+ region.

10. The device according to claim 1, wherein said silicon carbide semiconductive material of said source region and said drain region each includes a P+ conductivity region and a P conductivity region.

* * * * *